United States Patent
Bollesen

[19]

[11] Patent Number: 6,125,037
[45] Date of Patent: Sep. 26, 2000

[54] SELF-LOCKING HEAT SINK ASSEMBLY AND METHOD

[75] Inventor: Vernon P. Bollesen, Milpitas, Calif.

[73] Assignee: Sun Microsystems, Inc., Palo Alto, Calif.

[21] Appl. No.: 09/385,159

[22] Filed: Aug. 30, 1999

[51] Int. Cl.[7] .................................................. H05K 7/20
[52] U.S. Cl. .......................... 361/704; 361/707; 361/709; 361/712; 361/718; 361/719; 257/718; 257/719; 257/726; 257/727; 174/16.3; 165/80.3; 165/185; 24/457; 24/458; 248/510
[58] Field of Search .................................. 361/704, 707, 361/709–712, 717–719, 722; 174/16.3; 165/80.3, 185; 257/706, 707, 718, 719, 726, 727; 248/510, 316.7, 316.1; 267/159, 160; 24/457, 458

[56] References Cited

U.S. PATENT DOCUMENTS

| | | | |
|---|---|---|---|
| 4,972,294 | 11/1990 | Moses, Jr. et al. | 361/704 |
| 5,077,638 | 12/1991 | Andersson et al. | 361/710 |
| 5,208,731 | 5/1993 | Blomquist | 361/704 |
| 5,253,702 | 10/1993 | Davidson et al. | 165/80.4 |
| 5,276,585 | 1/1994 | Smithers | 361/704 |
| 5,307,239 | 4/1994 | McCarty et al. | 361/704 |
| 5,329,426 | 7/1994 | Villani | 361/719 |
| 5,329,993 | 7/1994 | Ettehadieh | 165/104.14 |
| 5,343,362 | 8/1994 | Solberg | 361/710 |
| 5,367,193 | 11/1994 | Malladi | 257/707 |
| 5,373,009 | 12/1994 | Boitard et al. | 174/16.3 |
| 5,423,375 | 6/1995 | Chiou | 165/80.3 |
| 5,570,271 | 10/1996 | Lavochkin | 361/704 |
| 5,586,005 | 12/1996 | Cipolla et al. | 361/719 |
| 5,621,244 | 4/1997 | Lin | 257/713 |
| 5,699,229 | 12/1997 | Brownell | 361/719 |
| 5,748,446 | 5/1998 | Feightner et al. | 361/709 |
| 5,761,041 | 6/1998 | Hassanzadeh et al. | 361/704 |
| 5,847,928 | 12/1998 | Hinshaw et al. | 361/704 |
| 5,881,800 | 3/1999 | Chung | 165/80.3 |
| 5,884,692 | 3/1999 | Lee et al. | 165/80.3 |
| 5,959,350 | 9/1999 | Lee et al. | 257/712 |
| 5,991,151 | 11/1999 | Capriz | 361/704 |

*Primary Examiner*—Leo P. Picard
*Assistant Examiner*—Boris L. Chervinsky
*Attorney, Agent, or Firm*—Gunnison, McKay & Hodgson, L.L.P.; Serge J. Hodgson

[57] ABSTRACT

A heat sink assembly includes a heat sink having torque bars, the torque bars including lips and guides extending from the lips. A package is located between the heat sink and a circuit board. A heat sink retainer includes riser arms and ends connected to the riser arms, where the ends press against the lips. The riser arms press the guides towards the package and press apertures of the heat sink away from the package. In this manner, the retainer imparts torque on the heat sink which causes the heat sink to impart a downward force on the package. This downward force creates the thermal contact between the heat sink and the package.

19 Claims, 10 Drawing Sheets

SELF-LOCKING HEAT SINK ASSEMBLY AND METHOD

FIELD OF THE INVENTION

The present invention relates generally to the packaging of electronic components in electronic devices. More particularly, the present invention relates to the removable attachment of a heat sink to an integrated circuit package mounted on a circuit board in an electronic device.

BACKGROUND OF THE INVENTION

As the art moves towards smaller higher power integrated circuits such as SRAMs, heat transfer from the integrated circuit package (IC package) becomes increasingly difficult and more important. As used herein, the term "IC package" includes the heat generating integrated circuit as well as the packaging surrounding the integrated circuit.

One conventional technique to remove heat from an IC package is to employ a finned heat sink which is placed in thermal contact with the IC package. In this manner, heat generated by the IC package is conducted to the heat sink and then dissipated to the ambient environment.

Of importance, the heat sink must be reliably attached to the IC package in a manner which does not undesirably stress or damage the IC package or the circuit board to which the IC package is connected. One conventional technique is to employ a thermally conductive adhesive which bonds the heat sink to the IC package. However, thermally conductive adhesives do not adhere well to plastic IC packages resulting in an unacceptably high incidence of bond failure between the plastic IC package and the heat sink. Further, once the heat sink is bonded with the thermally conductive adhesive, it is difficult to remove the heat sink from the IC package without causing damage to the IC package, the heat sink or the circuit board. Yet, it is desirable to have a removable heat sink to readily allow chip repair, rework and/or replacement. Accordingly, it is desirable to avoid the use of thermally conductive adhesives altogether.

One prior art removable heat sink uses clips and/or fasteners to attach the heat sink directly to the IC package. However, when attached in this manner, the heat sink exerts undue force on the IC package which can damage and ultimately destroy the IC package. To avoid this problem, other removable heat sinks are attached directly to the circuit board to which the IC package is connected.

FIG. 1 is a side view of an electronic device 8 which includes a heat sink 10 directly attached by post type fastening members 12A to a circuit board 14 in accordance with the prior art. Located between heat sink 10 and circuit board 14 is an IC package 16 which generates heat during use. IC package 16 is typically electrically connected to circuit board 14 by one or more circuit interconnections, e.g., solder, which are not illustrated in FIG. 1 for purposes of clarity. Fastening members 12A urge heat sink 10 towards circuit board 14 and down onto IC package 16 to make the thermal contact between heat sink 10 and IC package 16.

Although providing the force necessary to make the thermal contact between heat sink 10 and IC package 16, fastening members 12A causes heat sink 10 to press unevenly on IC package 16. In particular, IC package 16 acts as a pivot between heat sink 10 and circuit board 14 so that end 10A of heat sink 10 is urged away from end 14A of circuit board 14 as indicated by arrows 18. This causes the force exerted by heat sink 10 on to IC package 16 to be greater at side 16A of IC package 16 than at side 16B. This uneven force distribution can damage and even crack IC package 16. Further, this uneven force distribution can create a gap between side 16B and heat sink 10 resulting in poor heat transfer between IC package 16 and heat sink 10. Alternatively, or in addition to, this uneven force distribution can cause circuit interconnection failure near side 16B of IC package 16. As those skilled in the art understand, these conditions can ultimately cause failure of device 8.

To avoid these drawbacks, it has become known in the art to attach both sides of heat sink 10 to circuit board 14. As an example, second post type fastening members 12B illustrated in dashed lines in FIG. 1 can be employed. This tends to equalize the force exerted by heat sink 10 on both sides 16A and 16B of IC package 16. However, this also causes the ends 14A, 14B of circuit board 14 to be pulled up by fastening members 12B, 12A, respectively, relative to the die attach region 14C of circuit board 14 to which IC package 16 is attached. This bending force, indicated by arrows 20, causes warpage of circuit board 14 such that circuit board 14 is displaced to a position 22. Over time, this warpage can cause device 8 to fail, e.g., from failure of circuit interconnections between IC package 16 and circuit board 14.

Accordingly, the art needs a heat sink assembly which results in even force application to the IC package and avoids circuit board warpage.

SUMMARY OF THE INVENTION

In accordance with the present invention, a structure includes a heat sink having a torque bar, the torque bar including a lip and a guide extending from the lip. The structure further includes a substrate which is typically a circuit board and a package having an electronic component. The package is located between the heat sink and the substrate. A retainer of the structure includes a riser arm and an end connected to the riser arm, where the riser arm of the retainer presses against the guide of the torque bar and where the end of the retainer presses against the lip of the torque bar.

In one embodiment, the heat sink further includes an aperture adjacent the torque bar. In accordance with this embodiment, the riser arm of the retainer presses the guide of the torque bar towards the package and presses the aperture of the heat sink away from the package. In this manner, the retainer imparts torque on the heat sink. This torque causes the heat sink to impart a downward, e.g., first, force on the package. This downward force creates the thermal contact between the heat sink and the package.

Of importance, the retainer presses the heat sink down uniformly on the package. Thus, the heat sink assembly in accordance with the present invention avoids damage caused by the application of uneven force distribution on the package of conventional heat sink assemblies.

Further, the downward force applied to the package by the heat sink is countered by an equal upward, e.g., second, force applied by a base section of the retainer on the substrate. By locating the base section directly opposite a die attach area of the substrate to which the package is attached, the upward force is transferred from the base section directly back to the heat sink without imparting any bending force or torque on the substrate. In this manner, a heat sink assembly in accordance with the present invention avoids circuit board warpage and the ultimate device failure of conventional heat sink assemblies.

Further, the retainer is designed to pass through the substrate at a distance from the die attach area. This allows greater utilization of the die attach area, e.g., allows more traces and/or vias to be located on or in the substrate at the die attach area, compared to a case where a retainer passes through the die attach area.

In one embodiment, the torque bar extends from a base of the heat sink. In accordance with this embodiment, the heat sink further includes fins extending from the base, the lip of the torque bar being recessed below the tops of the fins. By locating the lip below the tops of the fins, the fins protect the end of the retainer from getting caught, e.g., during maintenance of the device, thus insuring that the retainer does not become unintentionally detached from the heat sink. Tension in the retainer also securely holds the riser arm of the retainer in the guide of the torque bar thus further insuring that the retainer does not become unintentionally detached from the heat sink.

Also in accordance with the present invention, a method of pressing a heat sink into thermal contact with a package having an electronic component includes attaching the package to a substrate, the substrate having an aperture. An aperture of a heat sink is substantially aligning with the substrate aperture so that the package is located between the heat sink and the substrate. An end of a retainer is pressed through the substrate aperture and through the heat sink aperture. The end of the retainer is then slid along a guide of the heat sink and snapped over a lip of the heat sink to attach the retainer to the heat sink.

Of importance, the guide guides the end of the retainer as the end moves from the heat sink aperture to the lip. Upon reaching the lip, the end self-snaps over the lip. Thus, simply by pressing the retainer from the underside of the substrate, the retainer self- locks to the heat sink. This simplifies installation of the retainer compared to other retainers which require further manipulation to attach to the heat sink.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 1:
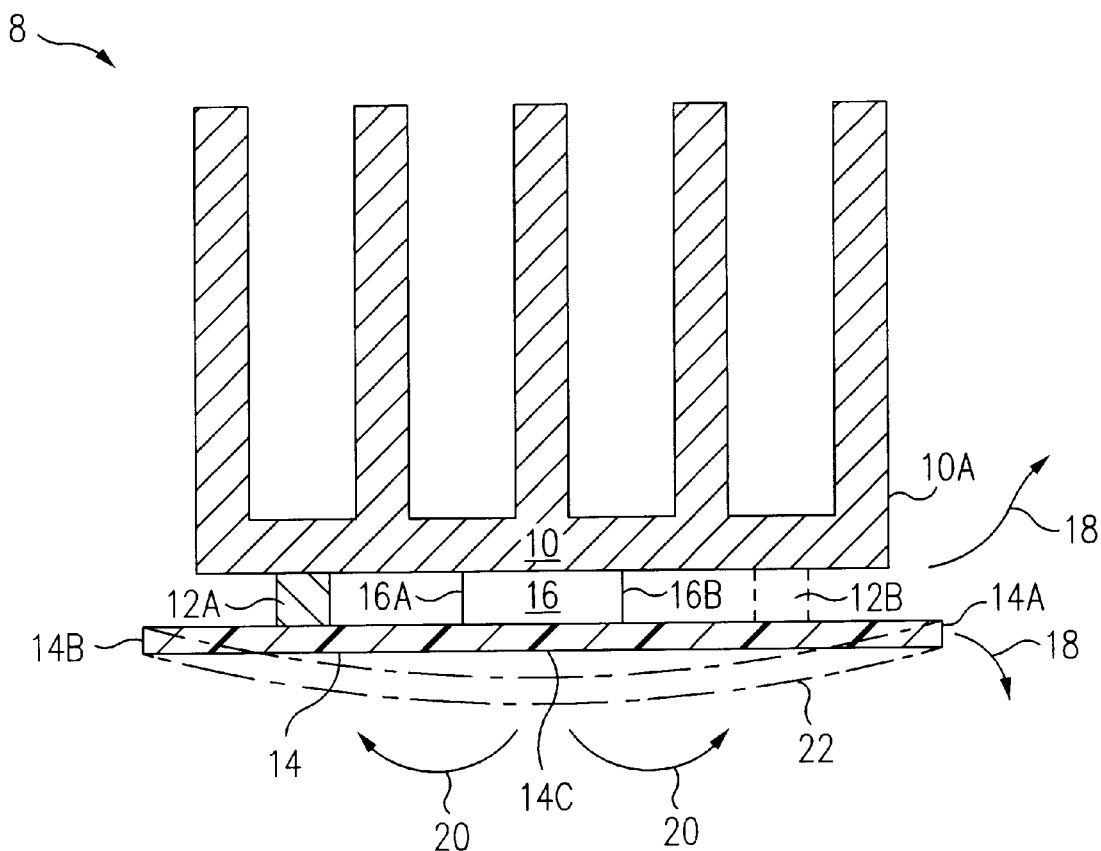
FIG. 1 is a side view of an electronic device which includes a heat sink directly attached by post type fastening members to a circuit board in accordance with the prior art.

This application is related to Bollesen, co-filed application Ser. No. 09/385,480, herein incorporated by reference in its entirety.

In accordance with the present invention, a device 100 (see FIGS. 2, 3B) includes a heat sink 112 having torque bars 140, each torque bar 140 including a lip 144 and a guide 142 extending from lip 144. Device 100 further includes a substrate 102 such as a circuit board. IC packages 104 each having an electronic component are located between heat sink 112 and substrate 102. A retainer 118 of device 100 includes riser arms 134 and heat sink latching ends 120 connected to riser arms 134, where riser arms 134 press against guides 142 (see FIG. 3D) and where heat sink latching ends 120 press against lips 144.

Heat sink 112 further includes apertures 124 adjacent torque bars 140. Riser arms 134 of retainer 118 press guides 142 towards IC packages 104 and press apertures 124 away from IC packages 104. In this manner, retainer 118 imparts torque on heat sink 112. This torque causes heat sink 112 to impart a downward, e.g., first, force on IC packages 104. This downward force creates the thermal contact between heat sink 112 and IC packages 104.

Of importance, retainer 118 presses heat sink 112 down uniformly on IC packages 104. Thus, a heat sink assembly in accordance with the present invention avoids damage caused by the application of uneven force distribution on the package of conventional heat sink assemblies.

Further, the downward force applied to IC packages 104 by heat sink 112 is countered by an equal upward, e.g., second, force applied by a base section 126 of retainer 118 on substrate 102, hereinafter referred to as circuit board 102. By locating base section 126 directly opposite a die attach area 108 of circuit board 102 to which IC packages 104 are attached, the upward force is transferred from base section 126 directly back to heat sink 112 without imparting any bending force or torque on circuit board 102. In this manner, a heat sink assembly in accordance with the present invention avoids circuit board warpage and the ultimate device failure of conventional heat sink assemblies.

Further, retainer 118 is designed to pass through apertures 122 of circuit board 102 at a distance from die attach area 108. This allows greater utilization of die attach area 108, e.g., allows more traces and/or vias to be located on or in circuit board 102 at die attach area 108, compared to a case where a retainer passes through the die attach area.

Figure 2:
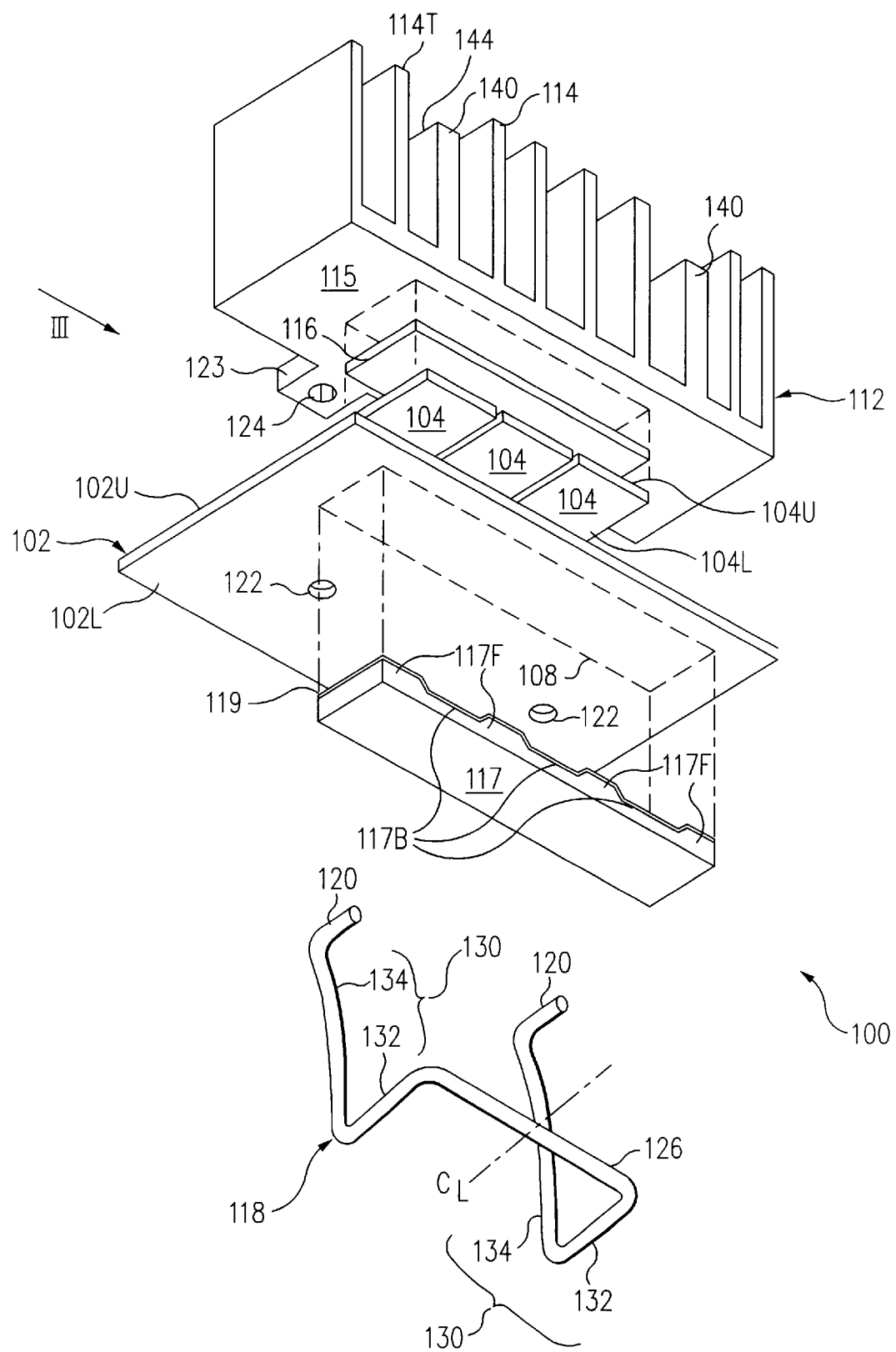
FIG. 2 is an exploded lower perspective view of an electronic device employing a heat sink assembly in accordance with the present invention.
Figure 3A:
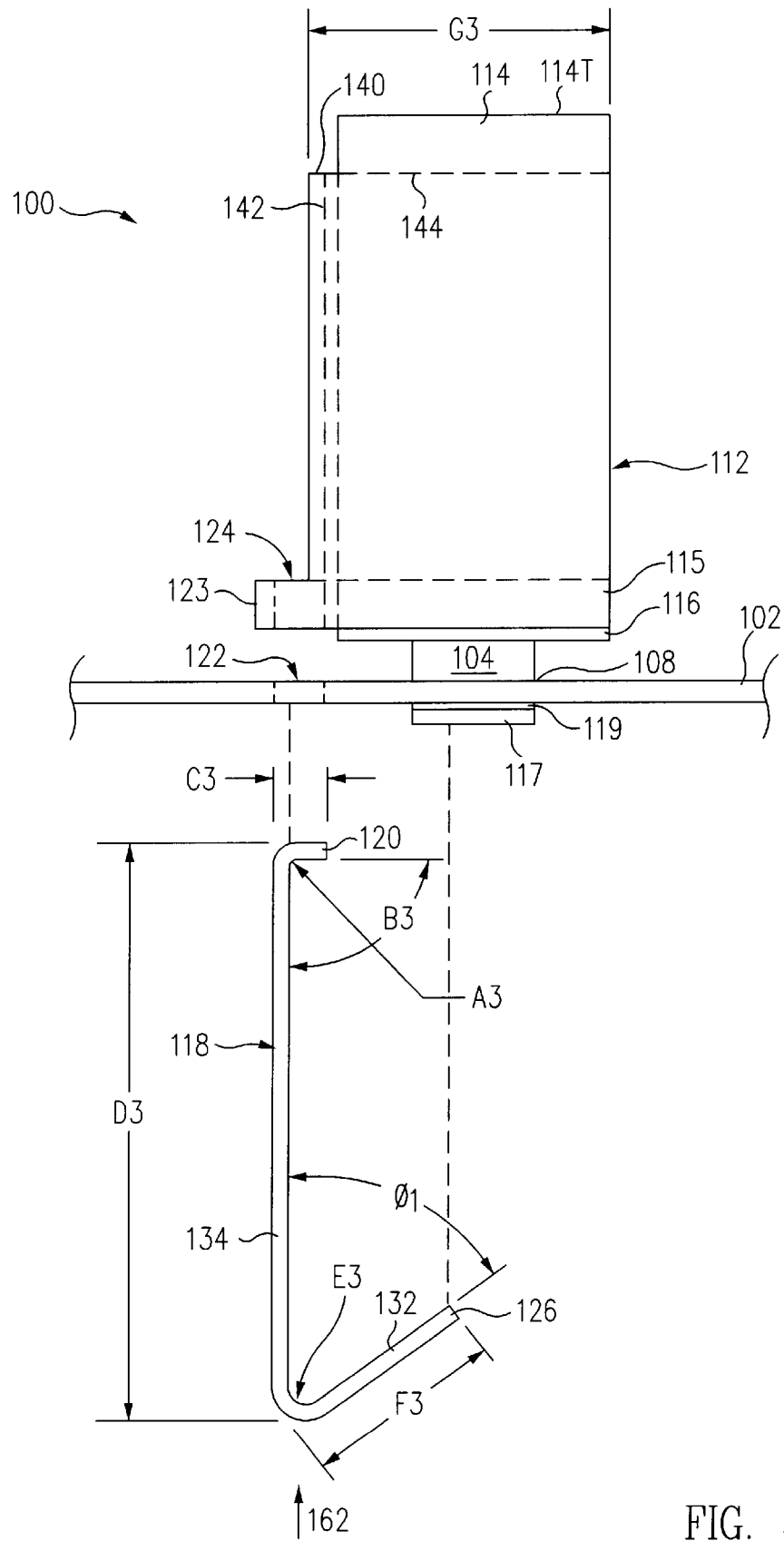
FIG. 3A is a side view of the device from the line III of FIG. 2.
Figure 3B:
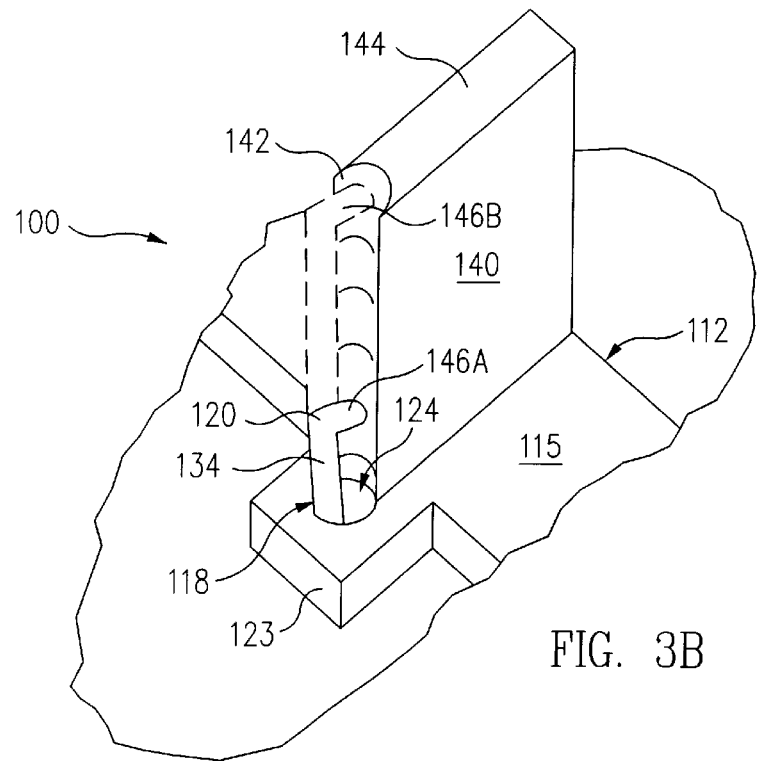
FIGS. 3B, 3C are upper perspective views of a section of the device of FIG. 2 illustrating the attachment of a retainer to a heat sink.
Figure 3C:
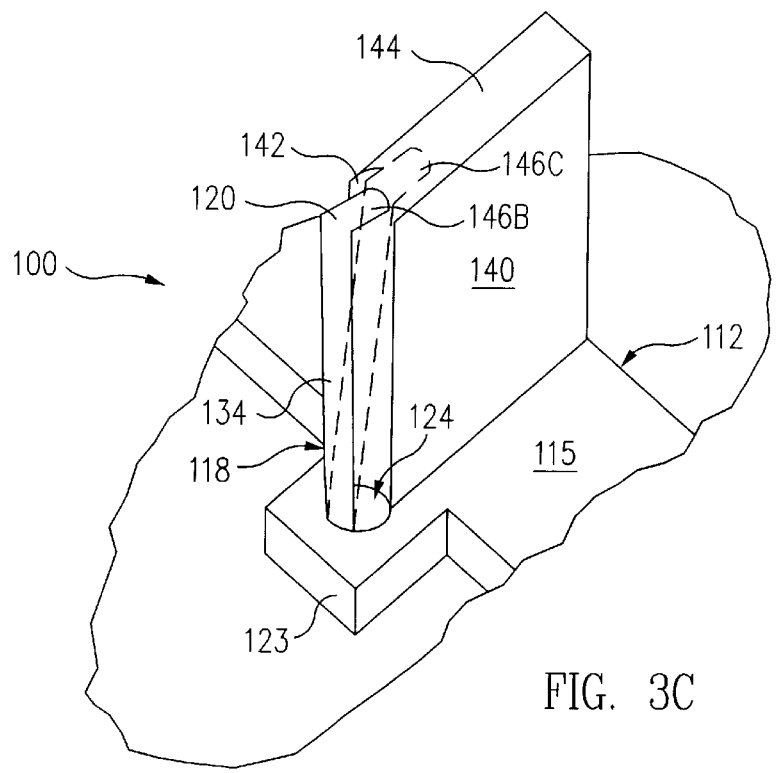
Figure 3D:
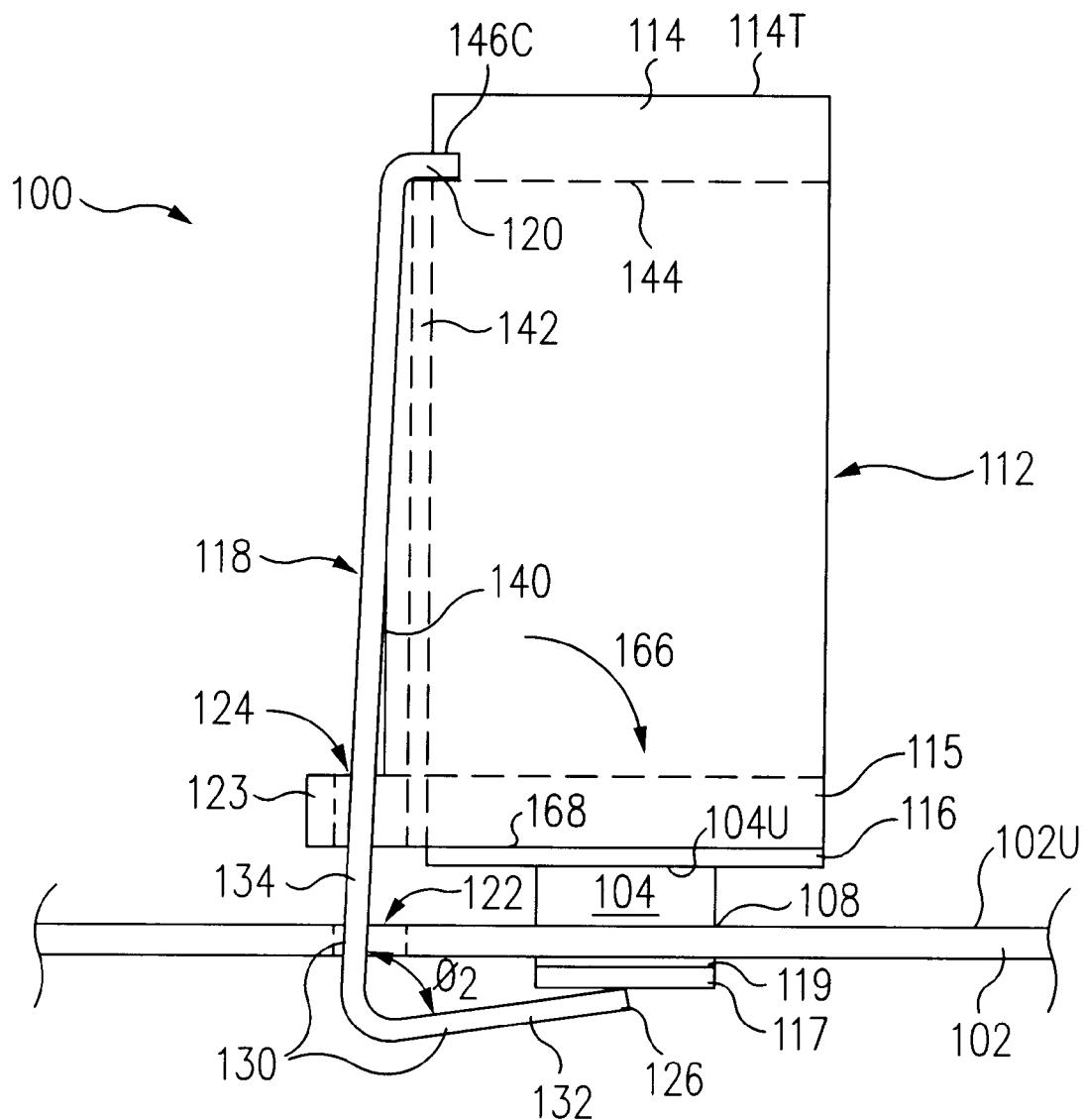
FIG. 3D is a side view of the device from the line III of FIG. 2 with the retainer attached to the heat sink.

Referring to FIGS. 2, 3D, torque bars 140 extend from a base 115 of heat sink 112. Heat sink 112 further includes fins 114 extending from base 115, lips 144 of torque bars 140 being recessed below tops 114T of fins 114. By locating lips 144 below tops 114T of fins 114, fins 114 protect heat sink latching ends 120 from getting caught, e.g., during maintenance of device 100, thus insuring that retainer 118 does not become unintentionally detached from heat sink 112. Tension in retainer 118 also securely holds riser arms 134 in guides 142 thus further insuring that retainer 118 does not become unintentionally detached from heat sink 112.

Also in accordance with the present invention, a method of pressing heat sink 112 into thermal contact with IC packages 104 includes attaching IC packages 104 to circuit board 102. Referring to FIG. 2, apertures 124 of heat sink 112 are substantially aligning with corresponding apertures 122 of circuit board 102 so that IC packages 104 are located between heat sink 112 and circuit board 102. Heat sink latching ends 120 of retainer 118 are pressed through corresponding aperture 122 of circuit board 102 and through corresponding apertures 124 of heat sink 112. Referring to FIGS. 3B, 3C, heat sink latching ends 120 are slid along guides 142 of heat sink 112 and snapped over lips 144 of heat sink 112 to attach retainer 118 to heat sink 112.

Of importance, guides 142 guide heat sink latching ends 120 as they move from apertures 124 to lips 144. Upon reaching lips 144, heat sink latching ends 120 self-snap over lips 144. Thus, simply by pressing retainer 118 from the underside of circuit board 102, retainer 118 self-locks to heat sink 112. This simplifies installation of retainer 118 compared to other retainers which require further manipulation to attach to the heat sink.

In more detail, FIG. 2 is an exploded lower perspective view of an electronic device 100 employing a heat sink assembly in accordance with the present invention. Device 100 includes circuit board 102. Attached to circuit board 102 are IC packages 104, i.e. a plurality of IC packages, which each include a heat generating electronic component such as an integrated circuit.

As shown in FIG. 2, lower surfaces 104L of IC packages 104 are attached to die attach area 108 of an upper surface 102U of circuit board 102. Generally, die attach area 108 includes the circuit board areas to which IC packages 104 are attached and also the immediate circuit board area around IC packages 104 including the circuit board area between adjacent ones of IC packages 104. IC packages 104 are attached typically by one or more circuit interconnections such as solder, solder balls, pins, or by adhesive. Although three IC packages 104 are illustrated in FIG. 2, a different number of packages can be attached to die attach area 108, e.g., one, two, four or more. For simplicity, IC packages 104 are hereinafter collectively referred to as IC package 104.

In thermal contact with a heat transfer surface 104U of IC package 104 is heat sink 112 having base 115 and fins 114 extending from base 115. Base 115 includes extension 123, each extension 123 including an aperture 124. Heat sink 112 is made of a material having a high thermal conductivity, e.g., is made of a metal such as aluminum or copper. Although fins 114 are illustrated in FIG. 2, other heat sink designs can also be used, e.g., solid heat sinks, plate type heat sinks, tower type heat sinks and disk shaped heat sinks.

Typically, a thermal pad 116 such as an elastomer having a thermally conductive filler, e.g., aluminum oxide and/or boron nitride, is interposed between heat sink 112 and IC package 104 although other materials such as thermally conductive grease can be used. An example of a suitable material for thermal pad 116 includes T-FLEX™ 240 manufactured by Thermagon, Inc. of Cleveland, Ohio. Illustratively, thermal pad 116 is 1.02 millimeters thick and may, or may not, have adhesive on one or both sides. In one embodiment, thermal pad 116 is compliant thus compensating for any mismatch in physical characteristics and thermal expansion between heat sink 112 and IC package 104. Further, in one embodiment, thermal pad 116 has a high thermal conductivity thus improving heat transfer between IC package 104 and heat sink 112 although, in an alternative embodiment, thermal pad 116 is not used and heat sink 112 directly contacts IC package 104.

Heat sink 112 is held in place and pressed into thermal contact with heat transfer surface 104U of IC package 104 by retainer 118. In this embodiment, retainer 118 is a wire having bent ends 120 which are used to attach retainer 118 to heat sink 112. Each of heat sink latching ends 120 pass through a corresponding one of apertures 122 in circuit board 102 and through a corresponding one of apertures 124 in extensions 123 of base 115 of heat sink 112 to attach retainer 118 to heat sink 112.

A standoff 117 is located between base section 126 of retainer 118 and circuit board 102. Standoff 117 distributes upward force from base section 126 over a greater area of circuit board 102. optionally, to protect circuit board 102 from standoff 117 and to prevent standoff 117 from moving, a protective pad 119, e.g., urethane foam with adhesive on both sides, is located between standoff 117 and circuit board 102 and more typically is attached to the upper surface of standoff 117. In one embodiment, protective pad 119 is 0.406 millimeter thick urethane foam having 0.05 millimeter thick pressure sensitive adhesive on each side and is attached to upper surfaces of foundation sections 117F of standoff 117. Although standoff 117 and protective pad 119 are illustrated in FIG. 2, use of standoff 117 and/or protective pad 119 is optional. For example, base section 126 can directly contact and press on circuit board 102. Generally, base section 126 supports circuit board 102.

As shown in FIG. 2, base section 126 of retainer 118 is integrally connected to heat sink latching ends 120 by spring elements 130. Spring elements 130 press heat sink latching ends 120 against heat sink 112. Each spring element 130 includes a lateral arm 132 and a riser arm 134 integrally connected together. Each lateral arm 132 is integrally connected to base section 126 and each riser arm 134 is integrally connected to a heat sink latching end 120, sometimes called a corresponding heat sink latching end 120. Generally, retainer 118 is symmetric around a centerline $C_L$.

Retainer 118 is made of a stiff flexible resilient material having a high spring rate. Thus retainer 118 has the ability to return to its original form, i.e. relaxed state, after being forced out of shape. For example, retainer 118 is made from full hard stainless steel spring wire or piano wire and has a diameter of 1.40 millimeters. Retainer 118 is typically integral, i.e. is a single piece, and is manufactured using well known techniques such as by bending a piece of wire.

FIG. 3A is a side view of device 100 from the line III of FIG. 2. Referring now to FIG. 3A, to clip heat sink 112 into place, heat sink 112 is positioned above circuit board 102 such that IC package 104 and thermal pad 116 are located between heat sink 112 and circuit board 102.

Each of apertures 124 in each of extensions 123 of heat sink 112 are substantially aligned with a different one of apertures 122 in circuit board 102. Thus, for each aperture 124 there is a corresponding aperture 122 in circuit board 102. Standoff 117 (and optionally protective pad 119) is (are) positioned below circuit board 102 directly opposite die attach area 108. Initially, retainer 118 is positioned in a relaxed state such that each heat sink latching end 120 is aligned directly below an aperture 122, sometimes called a corresponding aperture 122, in circuit board 102 as shown in FIG. 3A.

In a relaxed state, retainer 118 is unstressed. In this state, an angle $\theta_1$ between lateral arm 132 and riser arm 134 exists. Illustratively, angle $\theta_1$ is generally less than 90 degrees, typically is in the approximate range of 40 to 70 degrees, and in one embodiment is in the approximately range of 55 to 57 degrees.

To secure heat sink 112 into place with retainer 118, retainer 118 is pressed towards circuit board 102 as shown by the arrow 162. More particularly, heat sink latching ends 120 are pressed through corresponding apertures 122 in circuit board 102. While holding heat sink 112 in place, heat sink latching ends 120 are then pressed through apertures 124 in extensions 123 in heat sink 112.

FIGS. 3B, 3C are upper perspective views of a section of device 100 illustrating the attachment of retainer 118 to heat sink 112 in accordance with the present invention. As shown in FIG. 3B, heat sink 112 includes a torque bar 140 extending from base 115. Torque bar 140 is adjacent aperture 124 in extension 123 of base 115. Torque bar 140 includes a guide 142 which is a concave cylindrical channel surface of torque bar 140. Torque bar 140 further includes a lip 144. Lip 144 is an upper surface of torque bar 140 opposite and removed from base 115 and parallel with a plane defined by an upper surface of base 115. Lip 144 is perpendicular to the length of guide 142 and guide 142 extends downwards from lip 144 towards base 115 and to base 115. More particularly, guide 142 extends from lip 144 to aperture 124 in extension 123 of base 115.

After passing through aperture 124, heat sink latching end 120 is positioned in guide 142. Referring to FIGS. 3A, 3B together, retainer 118 is further pressed towards circuit board 102 (in the direction of arrow 162). This slides heat sink latching end 120 from a first position 146A along guide 142 away from base 115 towards lip 144 of torque bar 140.

Retainer 118 is pressed upwards so that base section 126 continues to move towards circuit board 102 until base section 126 contacts, and is prevented from moving further by, standoff 117. Once base section 126 contacts standoff 117, heat sink latching end 120 is at position 146B in guide 142 (FIG. 3B).

Referring now to FIGS. 3A, 3C together, lateral arm 132 is typically pressed towards circuit board 102 to move heat sink latching end 120 from position 146B vertically up and away from base 115. Upon reaching lip 144 of torque bar 140, heat sink latching end 120 snaps over and on to lip 144 to a position 146C (FIG. 3C) thus securing retainer 118 to heat sink 112. Of importance, tension in retainer 118 created when retainer 118 was pressed securely presses heat sink latching end 120 over lip 144.

As set forth above and illustrated in FIGS. 3B, 3C, guide 142 guides heat sink latching end 120 as it moves from aperture 124 to lip 144. Upon reaching lip 144, heat sink latching end 120 self-snaps over lip 144. Thus, simply by pressing base section 126 and lateral arms 132 (see FIG. 3A) from the underside of circuit board 102, retainer 118 self-locks to heat sink 112. This simplifies installation of retainer 118 compared to other retainers which require further manipulation to attach to the heat sink.

Once heat sink latching end 120 is snapped on to lip 144, tension in retainer 118 presses riser arm 134 into guide 142 thus insuring that retainer 118 does not become unintentionally detached from heat sink 112. As best shown in FIG. 3A, torque bar 140 is shorter than fins 114 so that lip 144 is recessed below tops 114T of fins 114, i.e., the distance between lip 144 and base 115 is less than the distance between tops 114T and base 115. By locating lip 144 below tops 114T, fins 114 protect heat sink latching end 120 from getting caught, e.g., during maintenance of device 100, thus further insuring that retainer 118 does not become unintentionally detached from heat sink 112.

In the above description, attachment of a single heat sink latching end 120 to a single torque bar 140 is described. In light of this disclosure it is understood that both heat sink latching ends 120 (see FIG. 2) are attached to corresponding torque bars 140 at the same time and in the same manner. Further, although two heat sink latching ends 120 and corresponding apertures 122, extensions 123, apertures 124 and torque bars 140 are set forth, it is understood that more or less than two heat sink latching ends 120 and corresponding apertures 122, extensions 123, apertures 124 and torque bars 140 can be used.

FIG. 3D is a side view of device 100 from the line III of FIG. 2 with retainer 118 attached to heat sink 112 in accordance with the present invention. Once attached to heat sink 112, heat sink latching ends 120 are located at a position 146C. At position 146C, the angle between lateral arm 132 and riser arm 134 is angle $\theta_2$, where angle $\theta_2$ is greater than angle $\theta_1$ between these elements when retainer 118 is in a relaxed state. For example, angle $\theta_2$ is in the approximate range of 70 to 85 degrees, and in one embodiment is approximately 80 degrees.

As a result of spring elements 130 being bent out of shape, retainer 118 is in tension. In particular, as a result of the change in the angle between lateral arms 132 and riser arms 134 from angle $\theta_1$ to angle $\theta_2$, and as a result of bending of lateral arms 132 and riser arms 134 themselves, retainer 118 is in tension. This tension causes each heat sink latching end 120 to press against its corresponding lip 144 downwards towards IC package 104. At the same time, this tension causes each riser arm 134 to press laterally towards IC 104 against its corresponding torque bar 140 adjacent lip 144 and, more particularly, to press laterally against its corresponding guide 142 adjacent lip 144, i.e., at the top of guide 142. Further, this tension also causes each riser arm 134 to press laterally against its corresponding aperture 124 in its corresponding extension 123.

As a net result, retainer 118 imparts torque on heat sink 112. In particular, riser arms 134 press laterally towards IC 104 (e.g., in a first lateral direction parallel to upper surface 102U of circuit board 102) against the tops of guides 142 adjacent lips 144 and press in the opposite lateral direction away from IC 104 (e.g., in a second lateral direction parallel to upper surface 102U of circuit board 102) against apertures 124 of extensions 123. This tends to twist heat sink 112 as indicated by the arrow 166 in FIG. 3D. As a result, heat sink 112 presses vertically down towards IC package 104. More particularly, heat sink 112 presses vertically down on thermal pad 116 which presses vertically down on IC package 104 thus creating the thermal contact between IC package 104 and heat sink 112.

Of importance, heat sink 112 presses down uniformly on IC package 104. This is because spring elements 130 of retainer 118 are symmetrically displaced and thus each impart equal torque on heat sink 112. This is also because lower surface 168 of heat sink 112 is substantially parallel to circuit board 102 and heat transfer surface 104U of IC package 104. Thus, a heat sink assembly in accordance with the present invention avoids the application of uneven force distribution on the IC package and the damage and ultimate device failure of conventional heat sink assemblies.

Of further importance, retainer 118 passes through circuit board 102 at a distance from die attach area 108. More particularly, riser arms 134 pass through apertures 122 which are located at a distance from die attach area 108. In one embodiment, the center of each aperture 122 is located approximately 5 millimeters from IC package 104. However, in light of this disclosure it is understood that 5 millimeters is only illustrative and that apertures 122 can be closer to, or further from, die attach area 108 and IC package 104. Locating apertures 122 at a distance from die attach area 108 allows greater utilization of die attach area 108, e.g., allows more traces and/or vias to be located on or in circuit board 102 at die attach area 108, compared to having apertures 122 in die attach area 108.

The vertical downward force, e.g., first force, applied on IC package 104 by heat sink 112 is countered by an equal vertical upward force, e.g., second force, applied by base section 126 of retainer 118 on circuit board 102 (via standoff 117 and protective pad 119) directly opposite IC package 104. As best seen in FIG. 3D, base section 126 is located adjacent circuit board 102 directly opposite from die attach area 108. Thus, the vertical upward force is transferred from base section 126 directly back to heat sink 112 through standoff 117, protective pad 119, circuit board 102, IC package 104 and thermal pad 116 without imparting any bending force or torque on circuit board 102. In this manner, a heat sink assembly in accordance with the present invention avoids circuit board warpage and the associated ultimate device failure of conventional heat sink assemblies.

Further, by sizing standoff 117 to be essentially the shape of IC package 104 and locating base section 126 directly opposite IC package 104, equal force distribution from base section 126 to IC package 104 is assured. For example, referring again to FIG. 2, a single IC package 104 can be located on upper surface 102U of circuit board 102 directly opposite each foundation section 117F of standoff 117, i.e., for a total of four IC packages 104 (instead of the three IC packages 104 illustrated). Further, bridge sections 117B can be used to pass over electronic components such as capacitors (not shown) extending down from a lower surface 102L of circuit board 102.

Heat sink 112 is also readily removed. Referring to FIG. 3D, to remove heat sink 112, heat sink latching ends 120 are pulled laterally away from IC package 104 and off of lips 144. Tension in retainer 118 then causes retainer 118 to move to position 146B (see FIG. 3C). Retainer 118 is then moved down so that heat sink latching ends 120 pass back through and out of apertures 124 in heat sink 112. Heat sink 112 is then removed.

Illustrative specifications for the various characteristics shown in FIG. 3A are provided below in Table 1.

TABLE 1

| Characteristic | Specification | Units |
|---|---|---|
| A3 | R0.38 MAX | millimeters |
| B3 | 90 | degrees |
| C3 | 3.68 | millimeters |
| D3 | 47.98 | millimeters |
| E3 | R1.02 | millimeters |
| F3 | 16.35 | millimeters |
| G3 | 22.38 | millimeters |
| θ$_1$ | 55 to 57 | degrees |

Figure 4:
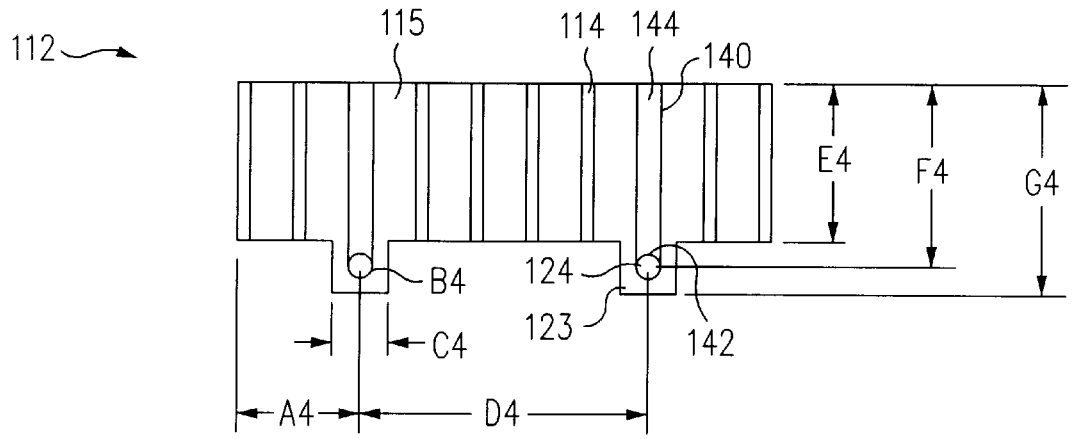
FIGS. 4, 5 are top and front views, respectively, of the heat sink of FIG. 2.

FIG. 4 is a top view of heat sink 112. Illustrative specifications for the various characteristics shown in FIG. 4 are provided below in Table 2.

TABLE 2

| Characteristic | Specification | Units |
|---|---|---|
| A4 | 2X 16.41 | millimeters |
| B4 | 3.81 | millimeters |
| C4 | 2X 7.62 | millimeters |
| D4 | 38.61 | millimeters |
| E4 | 20.09 | millimeters |

TABLE 2-continued

| Characteristic | Specification | Units |
|---|---|---|
| F4 | 23.01 | millimeters |
| G4 | 26.44 | millimeters |

Figure 5:
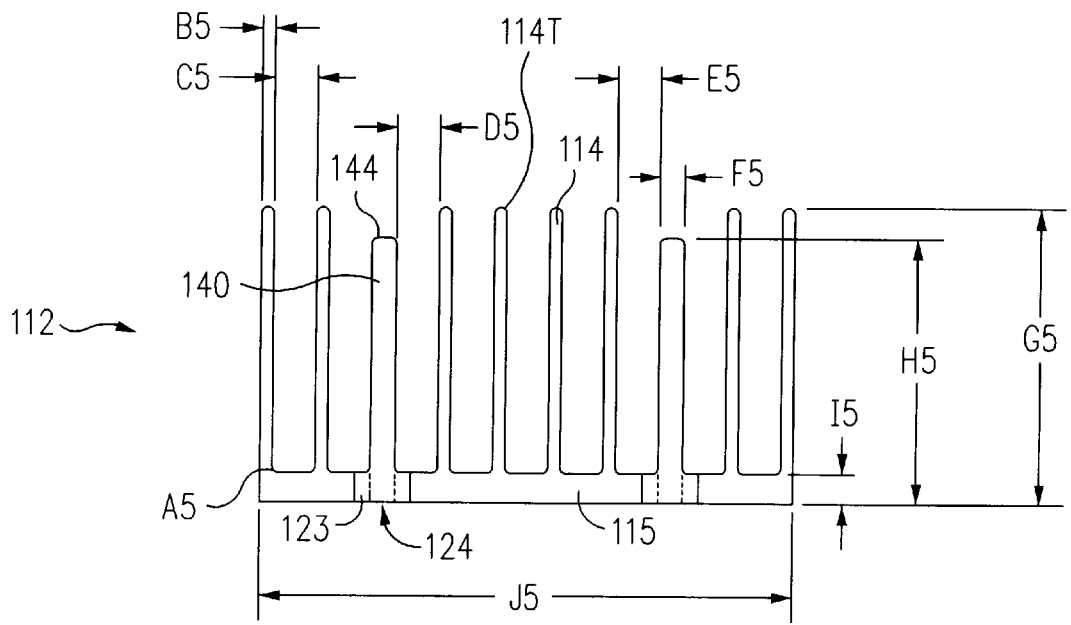

FIG. 5 is a front view of heat sink 112 in accordance with the present invention. Illustrative specifications for the various characteristics shown in FIG. 5 are provided below in Table 3.

TABLE 3

| Characteristic | Specification | Units |
|---|---|---|
| A5 | R0.76 TYP | millimeters |
| B5 | 8X 1.52 | millimeters |
| C5 | 7X 5.79 | millimeters |
| D5 | 5.61 | millimeters |
| E5 | 5.98 | millimeters |
| F5 | 2X 3.56 | millimeters |
| G5 | 38.10 | millimeters |
| H5 | 33.53 | millimeters |
| I5 | 3.81 | millimeters |
| J5 | 71.42 | millimeters |

Figure 6:
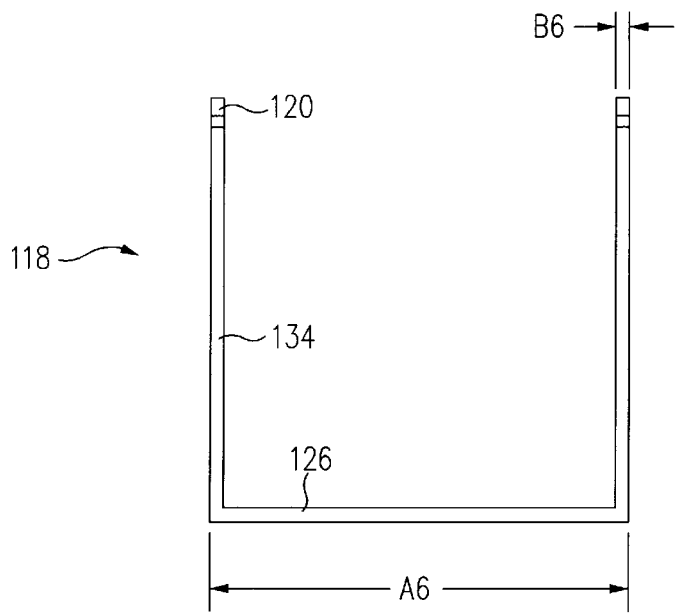
FIG. 6 is a front view of the retainer of FIG. 2.

FIG. 6 is a front view of retainer 118 in accordance with the present invention. Illustrative specifications for the various characteristics shown in FIG. 6 are provided below in Table 4.

TABLE 4

| Characteristic | Specification | Units |
|---|---|---|
| A6 | 40.01 | millimeters |
| B6 | 1.40 MAT'L STOCK | millimeters |

Figure 7:
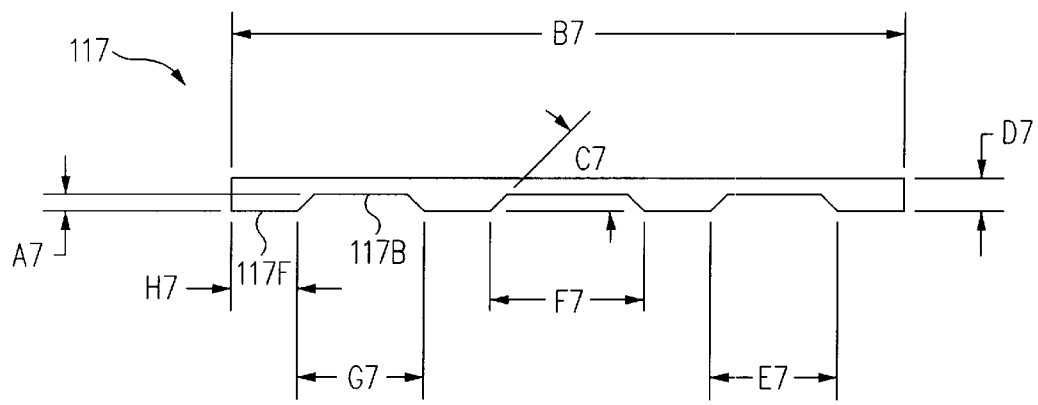
FIG. 7 is a front view of a standoff of FIG. 2.

FIG. 7 is a front view of standoff 117 in accordance with the present invention. Illustrative specifications for the various characteristics shown in FIG. 7 are provided below in Table 5.

TABLE 5

| Characteristic | Specification | Units |
|---|---|---|
| A7 | 1.64 | millimeters |
| B7 | 64.25 | millimeters |
| C7 | 6X 45 | degrees |
| D7 | 3.16 | millimeters |
| E7 | 12.25 | millimeters |
| F7 | 14.75 | millimeters |
| G7 | 12.25 | millimeters |
| H7 | 4X 6.25 | millimeters |

Figure 8:
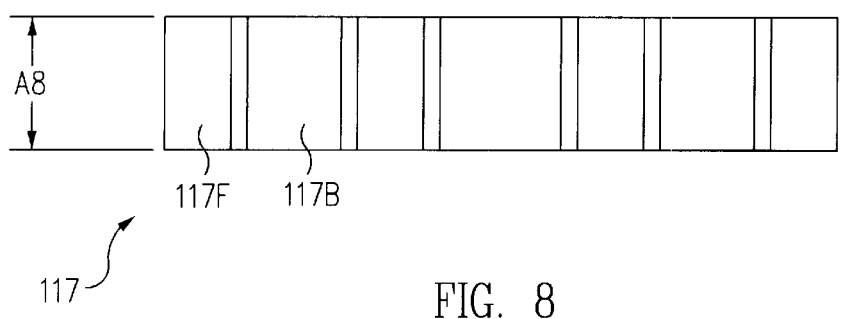
FIG. 8 is a bottom view of the standoff of FIG. 2.

FIG. 8 is a bottom view of standoff 117 in accordance with the present invention. An illustrative specification for the various characteristics shown in FIG. 8 is provided below in Table 6.

TABLE 6

| Characteristic | Specification | Units |
|---|---|---|
| A8 | 12.70 | millimeters |

Figure 9:
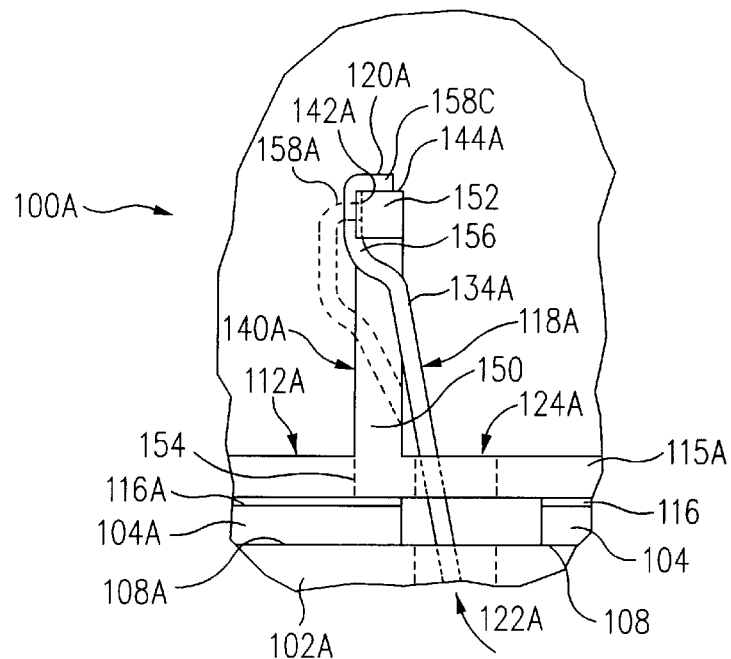
FIGS. 9 and 10 are side and upper perspective views, respectively, of a section of a heat sink and a retainer in accordance with an alternative embodiment of the present invention.
Figure 10:
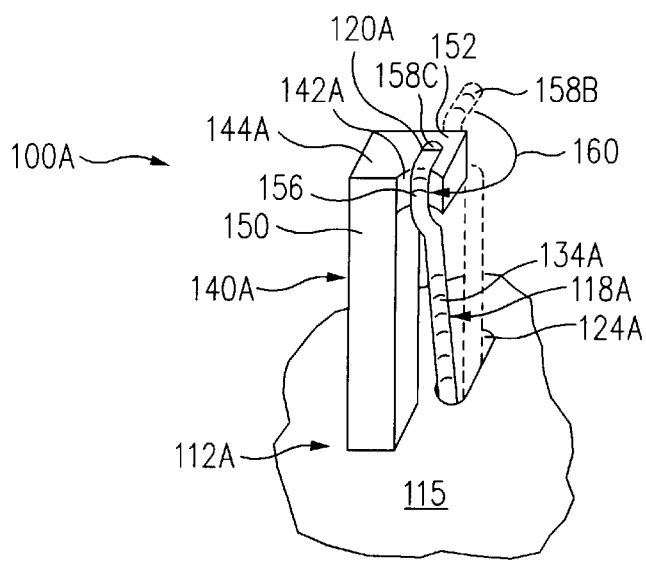

FIGS. 9 and 10 are side and upper perspective views, respectively, of a section of a heat sink 112A and retainer 118A in accordance with an alternative embodiment of the present invention. Heat sink 112A and retainer 118A are substantially similar to heat sink 112 and retainer 118 described above (e.g., see FIG. 2) and only the relevant differences are discussed below. Referring to FIGS. 9 and 10 together, in this embodiment, a torque bar 140A of heat sink 112A includes a rectangular bar 150 extending from base 115A of heat sink 112A. Torque bar 140A further includes a tab 152 located at an end of bar 150 opposite and removed from base 115A. Tab 152 laterally extends from bar 150. Tab 152 includes a guide 142A which is a concave cylindrical channel surface of tab 152. Tab 152 and bar 150 further includes a lip 144A. Lip 144A is a surface of torque bar 140A opposite and removed from base 115A and parallel with a plane defined by an upper surface of base 115A. Lip 144A is perpendicular to the length of bar 150. Guide 142A extends from lip 144A towards base 115A.

Heat sink 112A further includes an aperture 124A. As best seen in FIG. 9, aperture 124A is located adjacent torque bar 140A and forward of torque bar 140A towards IC package 104. Locating aperture 124A forward of torque bar 140A allows base 115A of heat sink 112A to end at torque bar 140A, e.g., to end at the line 154 in FIG. 9. Alternatively, base 115A can extend beyond torque bar 140A away from IC package 104 as shown in FIGS. 9, 10. For example, referring to FIG. 9, by extending base 115A beyond torque bar 140A, one or more additional IC packages 104A and thermal pad 116A are also located between heat sink 112A and circuit board 102A. IC packages 104A are attached to a second die attach area 108A, e.g., located between apertures 122A in circuit board 102A. Although illustrated in FIG. 9, IC packages 104A and thermal pad 116A are optional and in an alternative embodiment are not used.

Riser arm 134A of retainer 118A includes a series of bends which form a pocket 156 in riser arm 134A. Pocket 156 is shaped so that tab 152 fits into pocket 156 when retainer 118A is attached to heat sink 112A.

To attach retainer 118A to heat sink 112A, referring now to FIG. 9, heat sink latching end 120A of retainer 118A is positioned in guide 142A. Retainer 118A is then manipulated in a manner similar to that described in relation to retainer 118 in FIG. 3C so that heat sink latching end 120A move up along guide 142A from a position 158A and over lip 144A to a position 158C. Alternatively, referring to FIG. 10, heat sink latching end 120A is moved from a position 158B in front of torque bar 140A around tab 152 as shown by arrow 160 and over lip 144A to position 158C. Once secured, retainer 118A imparts torque on heat sink 112A in a manner similar to that described above in relation to retainer 118 and heat sink 112. Although attachment of a single riser arm 134A and heat sink latching end 120A to a single torque bar 140A is described above and illustrated in FIGS. 9, 10, in light of this disclosure, it is understood that typically more than one, e.g., two, riser arms 134A and heat sink latching ends 120A are provided and attached to corresponding torque bars 140A.

Figure 11:
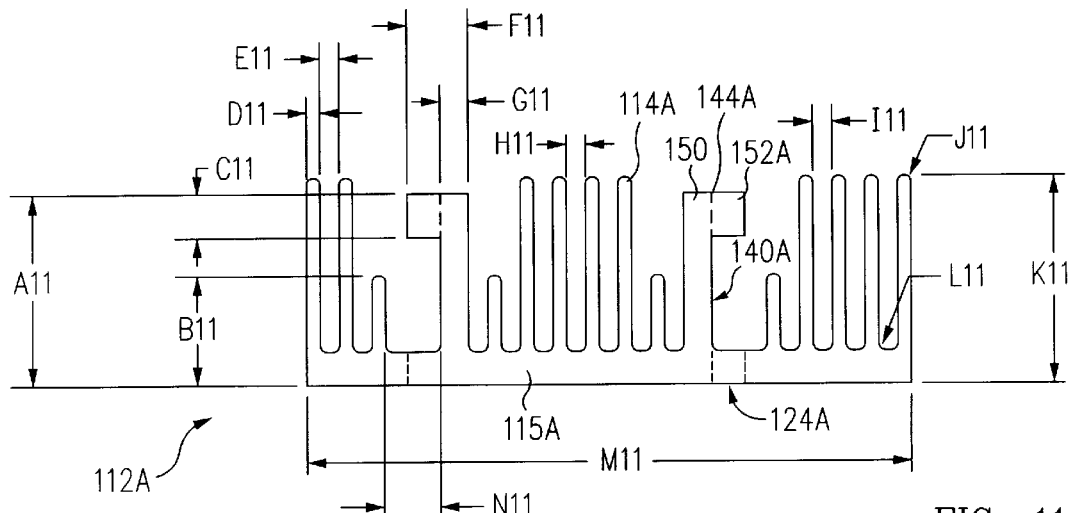
FIGS. 11, 12, 13 are front, top and side views of the heat sink in accordance with the alternative embodiment.

FIG. 11 is a front view of heat sink 112A in accordance with this embodiment. Illustrative specifications for the various characteristics shown in FIG. 11 are provided below in Table 7.

TABLE 7

| Characteristic | Specification | Units |
| --- | --- | --- |
| A11 | 22.90 | millimeters |
| B11 | 13.21 | millimeters |

TABLE 7-continued

| Characteristic | Specification | Units |
| --- | --- | --- |
| C11 | 5.59 | millimeters |
| D11 | 14X 1.65 | millimeters |
| E11 | 2X 2.46 | millimeters |
| F11 | 2X 7.87 | millimeters |
| G11 | 2X 3.55 | millimeters |
| H11 | 7X 2.35 | millimeters |
| I11 | 4X 2.36 | millimeters |
| J11 | FULL R TYP | |
| K11 | 25.60 | millimeters |
| L11 | FULL R TYP | |
| M11 | 74.25 | millimeters |
| N11 | 2X 6.87 | millimeters |

Figure 12:
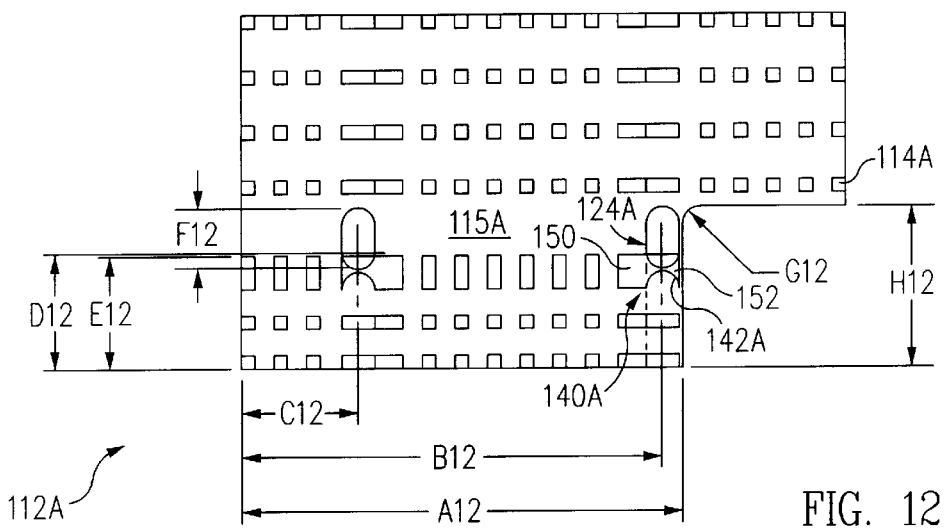

FIG. 12 is a top view of heat sink 112A in accordance with this embodiment. Illustrative specifications for the various characteristics shown in FIG. 12 are provided below in Table 8.

TABLE 8

| Characteristic | Specification | Units |
| --- | --- | --- |
| A12 | 54.45 | millimeters |
| B12 | 52.00 | millimeters |
| C12 | 14.79 | millimeters |
| D12 | 14.61 | millimeters |
| E12 | 14.19 | millimeters |
| F12 | 2X SLOT 7.12 LONG 3.81 | millimeters |
| G12 | R1.52 | millimeters |
| H12 | 20.12 | millimeters |

Figure 13:
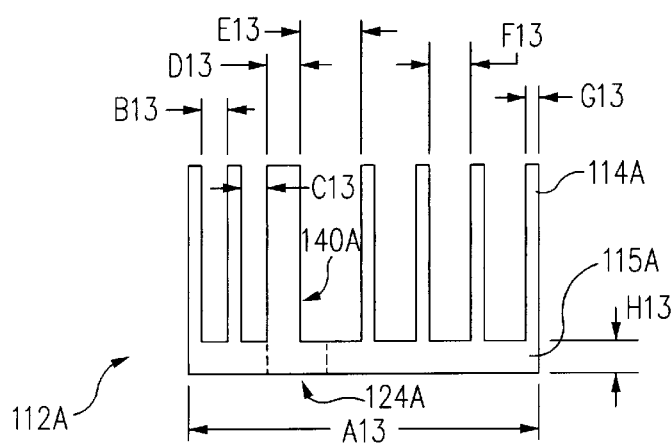

FIG. 13 is a side view of heat sink 112A in accordance with this embodiment. Illustrative specifications for the various characteristics shown in FIG. 13 are provided below in Table 9.

TABLE 9

| Characteristic | Specification | Units |
| --- | --- | --- |
| A13 | 43.03 | millimeters |
| B13 | 3.45 | millimeters |
| C13 | 3.50 | millimeters |
| D13 | 3.94 | millimeters |
| E13 | 7.51 | millimeters |
| F13 | 3X 4.91 | millimeters |
| G13 | 6X 1.65 | millimeters |
| H13 | 3.81 | millimeters |

Figure 14:
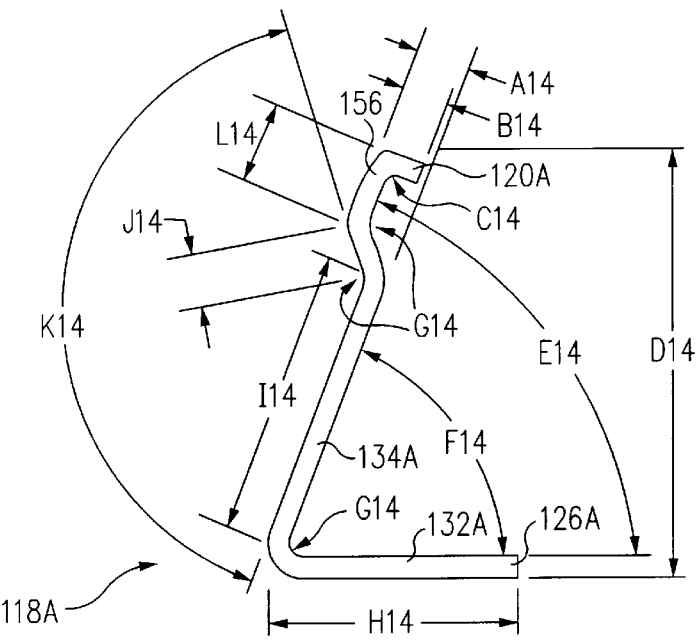
FIGS. 14, 15, 16 are side, bottom and front views of the retainer in accordance with the alternative embodiment.

FIG. 14 is a side view of retainer 118A in accordance with this embodiment. Illustrative specifications for the various characteristics shown in FIG. 14 are provided below in Table 10.

TABLE 10

| Characteristic | Specification | Units |
| --- | --- | --- |
| A14 | 4.66 | millimeters |
| B14 | 2.84 TO 2.92 | millimeters |
| C14 | R0.38 MAX | millimeters |
| D14 | 34.98 | millimeters |
| E14 | 63 TO 66 | degrees |
| F14 | 63 TO 66 | degrees |
| G14 | 3X R1.52 | millimeters |
| H14 | 16.51 | millimeters |
| I14 | 21.01 | millimeters |
| J14 | 4.32 | millimeters |

TABLE 10-continued

| Characteristic | Specification | Units |
|---|---|---|
| K14 | 140 TO 143 | degrees |
| L14 | 5.08 | millimeters |

Figure 15:
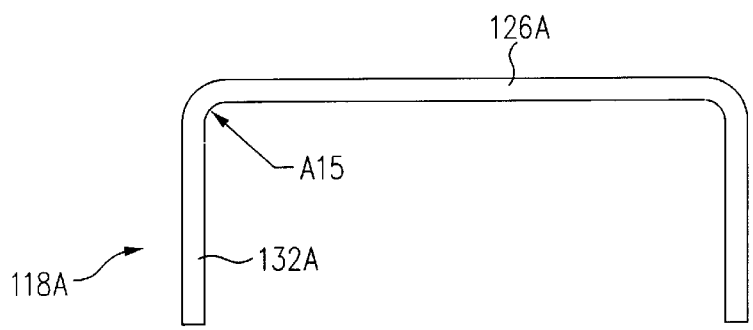

FIG. 15 is a bottom view of retainer 118A in accordance with this embodiment. An illustrative specifications for the various characteristics shown in FIG. 15 is provided below in Table 11.

TABLE 11

| Characteristic | Specification | Units |
|---|---|---|
| A15 | 2X R1.52 | millimeters |

Figure 16:
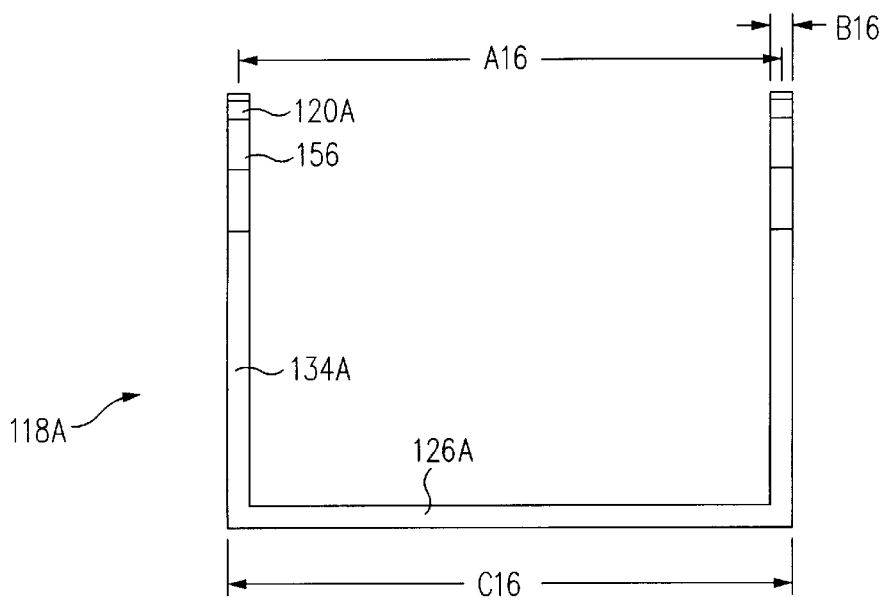

FIG. 16 is a front view of retainer 118A in accordance with this embodiment. Illustrative specifications for the various characteristics shown in FIG. 16 are provided below in Table 12.

TABLE 12

| Characteristic | Specification | Units |
|---|---|---|
| A16 | 37.21 | millimeters |
| B16 | 1.40 MAT'L STOCK | millimeters |
| C16 | 38.61 | millimeters |

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A structure comprising:
a heat sink having a torque bar, said torque bar comprising a lip and a guide extending from said lip;
a substrate;
a package comprising an electronic component, wherein said package is located between said heat sink and said substrate;
a retainer having a spring element comprising a riser arm, an end connected to said riser arm, and a base section connected to said end by said spring element, wherein said riser arm presses against said guide, wherein said end presses against said lip, and wherein said base section supports said substrate directly opposite said package.

2. The structure of claim 1 wherein said heat sink further comprises an aperture adjacent said torque bar, said riser arm pressing said guide towards said package and pressing said aperture away from said package.

3. The structure of claim 2 wherein said heat sink imparts a first force on said package, said first force being countered by a second force applied by said base section of said retainer on said substrate.

4. The structure of claim 1 wherein said guide is a concave cylindrical channel surface of said torque bar.

5. The structure of claim 4 wherein said lip is perpendicular to a length of said guide.

6. The structure of claim 1 wherein said torque ar extends from a base of said heat sink.

7. The structure of claim 6 wherein said lip is a surface of said torque bar opposite and removed from said base and parallel with a plane defined by an upper surface of said base.

8. The structure of claim 6 wherein said guide extends from said lip to said base.

9. The structure of claim 6 wherein said base comprises an extension and an aperture in said extension, said guide extending from said lip to said aperture.

10. The structure of claim 6 wherein said heat sink further comprises a fin extending from said base, wherein said lip is recessed below a top of said fin.

11. The structure of claim 6 wherein said heat sink further comprises a fin extending from said base, wherein a distance between said base and said lip is less than a distance between said base and a top of said fin.

12. The structure of claim 1 wherein said torque bar is one of a plurality of torque bars of said heat sink and said riser arm and end are one of a plurality of riser arms and ends of said retainer.

13. A structure comprising:
a heat sink having a torque bar, said torque bar comprising a lip and a guide extending from said lip, wherein said torque bar further comprises a bar and a tab extending from said bar, said tab comprising said guide;
a substrate;
a package comprising an electronic component, wherein said package is located between said heat sink and said substrate;
a retainer having a spring element comprising a riser arm, an end connected to said riser arm, and a base section connected to said end by said spring element, wherein said riser arm presses against said guide, wherein said end presses against said lip, and wherein said base section supports said substrate directly opposite said package.

14. The structure of claim 13 wherein said heat sink further comprises an aperture adjacent said torque bar towards said package.

15. The structure of claim 13 wherein said riser arm comprises a series of bends.

16. The structure of claim 15 wherein said series of bends form a pocket which fits said tab.

17. A structure comprising:
a heat sink having a torque bar, said torque bar comprising a lip and a guide extending from said lip, said heat sink further comprising an aperture adjacent said torque bar;
a substrate;
a package comprising an electronic component, said package being located between said heat sink and said substrate;
a retainer comprising:
a spring element comprising a riser arm;
an end connected to said riser arm; and
a base section connected to said end by said spring element,
said riser arm pressing against said guide towards said package and pressing said aperture away from said package, said end pressing against said lip, and said base section supporting said substrate directly opposite said package, wherein said retainer imparts torque on said heat sink.

18. A method comprising:
attaching a package comprising an electronic component to a substrate, said substrate having an aperture;
aligning an aperture of a heat sink with said substrate aperture, said package being located between pressing an end of a retainer through said substrate aperture and through said heat sink aperture;

sliding said end along a guide of said heat sink; and snapping said end over a lip of said heat sink, wherein a base section of said retainer supports said substrate opposite said package.

19. The method of claim 18 wherein said heat sink comprises a base having said heat sink aperture and a torque bar adjacent said heat sink aperture, said torque bar comprising said guide, said sliding comprising sliding said end away from said base.

* * * * *

UNITED STATES PATENT AND TRADEMARK OFFICE
CERTIFICATE OF CORRECTION

PATENT NO : 6,125,037
DATED : Sept. 26, 2000
INVENTOR(S) : Vernon P. Bollesen

It is certified that error appears in the above-identified patent and that said Letters Patent is hereby corrected as shown below:

At Col. 13, line 66, change "torque ar" to --torque bar--.

At Col. 14, line 67, after "between" insert --said heat sink and said substrate;--.

Signed and Sealed this

Eighth Day of May, 2001

*Attest:*

NICHOLAS P. GODICI

*Attesting Officer*  Acting Director of the United States Patent and Trademark Office